US012665605B1

(12) United States Patent
Puzzo et al.

(10) Patent No.: US 12,665,605 B1
(45) Date of Patent: Jun. 23, 2026

(54) HYBRID WIDEBAND / NARROWBAND DIRECT DIGITAL TRANSCEIVER

(71) Applicant: BAE Systems Information and Electronic Systems Integration Inc., Nashua, NH (US)

(72) Inventors: Dean C. Puzzo, Alton Bay, NH (US); Michael W. Blum, Milford, NH (US); Christopher R. Bye, Bedford, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 111 days.

(21) Appl. No.: 18/940,291

(22) Filed: Nov. 7, 2024

(51) Int. Cl.
*H03M 1/02* (2006.01)
*H04B 1/403* (2015.01)

(52) U.S. Cl.
CPC .............. *H03M 1/02* (2013.01); *H04B 1/406* (2013.01)

(58) Field of Classification Search
CPC ................................. H03M 1/02; H04B 1/406
See application file for complete search history.

(56) References Cited

U.S. PATENT DOCUMENTS

| | | | |
|---|---|---|---|
| 6,415,001 B1 | 7/2002 | Li et al. | |
| 6,448,926 B1 | 9/2002 | Weinberg et al. | |
| 6,526,264 B2 | 2/2003 | Sugar et al. | |
| 6,678,512 B1 | 1/2004 | Kaminski et al. | |

| | | | |
|---|---|---|---|
| 6,847,812 B2 * | 1/2005 | Doetsch ................. | H03D 3/007 |
| | | | 455/316 |
| 6,895,232 B2 | 5/2005 | Parker | |
| 7,542,519 B2 | 6/2009 | McCallister | |
| 7,599,010 B2 * | 10/2009 | Yen ................... | H04N 21/42638 |
| | | | 348/731 |
| 8,311,156 B2 | 11/2012 | Seendripu et al. | |
| 8,345,798 B2 | 1/2013 | Petrovic et al. | |
| 8,604,864 B2 * | 12/2013 | Ranta ................... | H03K 17/162 |
| | | | 327/434 |
| 8,705,675 B2 | 4/2014 | Lolis et al. | |
| 8,938,023 B2 * | 1/2015 | Aparin ................... | H04L 27/38 |
| | | | 375/267 |

(Continued)

FOREIGN PATENT DOCUMENTS

| | | |
|---|---|---|
| EP | 2403145 A1 | 1/2012 |
| EP | 3868024 A1 | 8/2021 |
| WO | WO2000052840 A1 | 9/2000 |

*Primary Examiner* — Lam T Mai
(74) *Attorney, Agent, or Firm* — Scott J. Asmus

(57) ABSTRACT

A hybrid wideband/narrowband direct digital transceiver. In an example, the transceiver includes a first-stage downconverter configured to convert a radio frequency (RF) input analog signal to a first intermediate frequency (IF1) narrowband (NB) input analog signal; a second-stage downconverter configured to convert the IF1 NB input analog signal or a millimeter wave (mmW) input analog signal to a second intermediate frequency (IF2) NB input analog signal; one or more analog to digital converters (ADCs) configured to convert one or more of the IF1 NB input analog signal, the IF2 NB input analog signal, and the RF input analog signal to digital input signals; and a processor configured to control the first-stage downconverter to set a center frequency and bandwidth of the IF1 NB input analog signal and control the second-stage downconverter to set a center frequency and bandwidth of the IF2 NB input analog signal.

20 Claims, 10 Drawing Sheets

(56) References Cited

U.S. PATENT DOCUMENTS

| 9,432,063 | B2 * | 8/2016 | Ou | H04B 1/0475 |
| 9,438,458 | B1 * | 9/2016 | Santa | H04L 27/2334 |
| 9,450,598 | B2 | 9/2016 | Taratorin et al. | |
| 9,673,842 | B2 | 6/2017 | Fernando et al. | |
| 10,917,163 | B2 | 2/2021 | Rutt et al. | |
| 11,664,832 | B1 * | 5/2023 | Puzzo | H04B 1/0096 |
| | | | | 375/262 |
| 11,838,038 | B2 | 12/2023 | Carbone et al. | |
| 11,984,914 | B2 | 5/2024 | Puzzo et al. | |
| 2002/0083109 | A1 * | 6/2002 | Willson, Jr. | H03M 3/462 |
| | | | | 708/700 |
| 2003/0203743 | A1 * | 10/2003 | Sugar | H04B 1/0057 |
| | | | | 455/103 |
| 2006/0078069 | A1 * | 4/2006 | Seendripu | H03D 7/166 |
| | | | | 375/316 |
| 2006/0083335 | A1 * | 4/2006 | Seendripu | H03D 3/008 |
| | | | | 375/332 |
| 2006/0256216 | A1 * | 11/2006 | Takahiko | H03D 7/18 |
| | | | | 348/264 |
| 2007/0001891 | A1 * | 1/2007 | Mazhar | H03M 1/1225 |
| | | | | 341/161 |
| 2008/0143575 | A1 * | 6/2008 | Nara | H03M 1/004 |
| | | | | 341/157 |
| 2009/0115651 | A1 * | 5/2009 | Hoang | H03M 1/069 |
| | | | | 341/141 |
| 2010/0007538 | A1 * | 1/2010 | Balachandran | H03M 3/344 |
| | | | | 341/143 |
| 2014/0270008 | A1 * | 9/2014 | Goodson | H04B 7/0817 |
| | | | | 375/340 |
| 2015/0015428 | A1 * | 1/2015 | Snelgrove | H03M 3/458 |
| | | | | 341/155 |
| 2019/0123759 | A1 * | 4/2019 | Kumar | H03M 1/38 |
| 2022/0029774 | A1 * | 1/2022 | Yuan | H04B 1/525 |
| 2022/0065893 | A1 * | 3/2022 | Zamprogno | H03M 1/183 |
| 2023/0283310 | A1 * | 9/2023 | Akhtar | H04B 1/123 |
| | | | | 455/232.1 |
| 2023/0299809 | A1 | 9/2023 | Hayslett et al. | |

* cited by examiner

Transceiver Platform
100

1st Stage Up-converter
220

2nd Stage Up-converter
210

1st Stage Down-converter
230

2nd Stage Down-converter
240

800

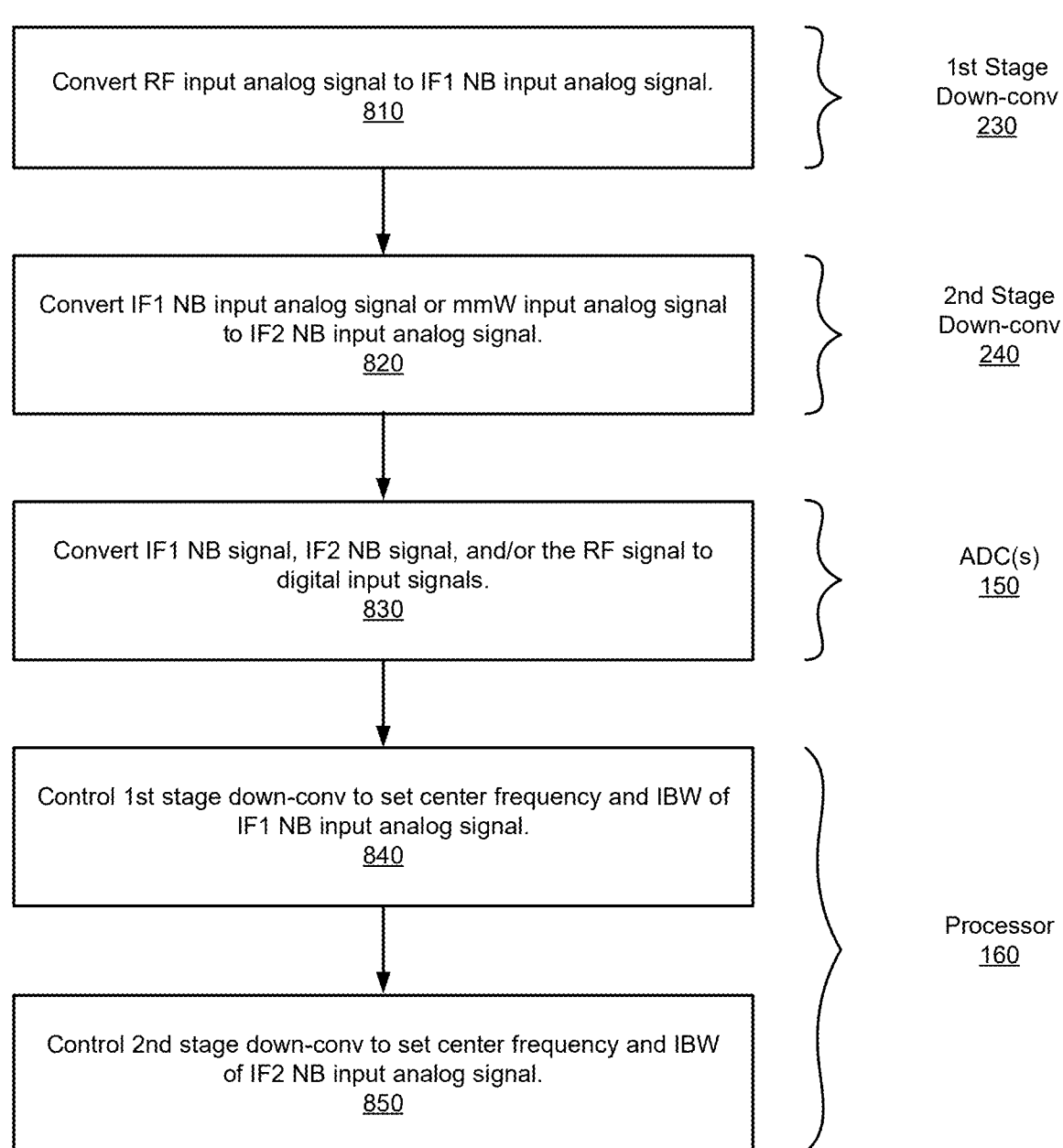

Convert RF input analog signal to IF1 NB input analog signal.
810

1st Stage
Down-conv
230

Convert IF1 NB input analog signal or mmW input analog signal
to IF2 NB input analog signal.
820

2nd Stage
Down-conv
240

Convert IF1 NB signal, IF2 NB signal, and/or the RF signal to
digital input signals.
830

ADC(s)
150

Control 1st stage down-conv to set center frequency and IBW of
IF1 NB input analog signal.
840

Control 2nd stage down-conv to set center frequency and IBW
of IF2 NB input analog signal.
850

Processor
160

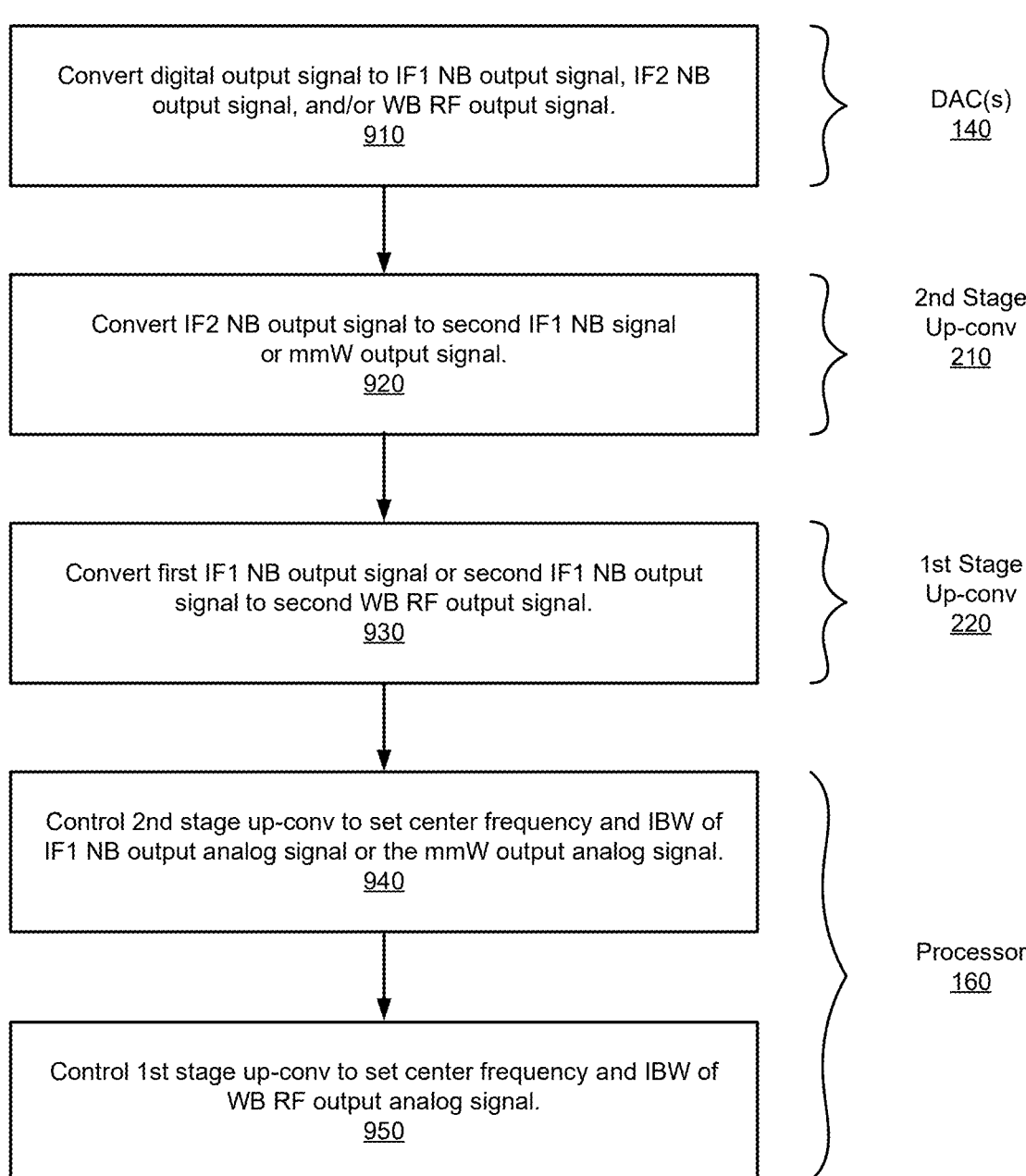

Convert digital output signal to IF1 NB output signal, IF2 NB output signal, and/or WB RF output signal.
910

DAC(s)
140

Convert IF2 NB output signal to second IF1 NB signal or mmW output signal.
920

2nd Stage
Up-conv
210

Convert first IF1 NB output signal or second IF1 NB output signal to second WB RF output signal.
930

1st Stage
Up-conv
220

Control 2nd stage up-conv to set center frequency and IBW of IF1 NB output analog signal or the mmW output analog signal.
940

Processor
160

Control 1st stage up-conv to set center frequency and IBW of WB RF output analog signal.
950

FIG. 9

Processing Platform
1000

HYBRID WIDEBAND / NARROWBAND DIRECT DIGITAL TRANSCEIVER

FIELD OF DISCLOSURE

The present disclosure relates to transceivers, and more particularly to an adaptable hybrid wideband/narrowband radio frequency (RF) and millimeter wave (mmW) direct digital transceiver.

BACKGROUND

A radio frequency (RF) transceiver typically includes a downconverter (or tuner) for receiving signals and an upconverter for transmitting signals. The downconverter converts received RF input signals down to intermediate frequency (IF) or baseband signals of a desired center frequency and bandwidth. The upconverter converts baseband or IF signals up to RF signals for transmission. Operational requirements for transceivers generally call for increased instantaneous bandwidth (IBW) and increased instantaneous dynamic range (IDR), to deal with evolving threat environments, while simultaneously requiring reduced size, weight, power consumption, and cost.

BRIEF DESCRIPTION OF THE DRAWINGS

FIG. 8 is a flowchart illustrating a methodology for operation of the hybrid receiver of FIG. 2, in accordance with an embodiment of the present disclosure.

FIG. 9 is a flowchart illustrating a methodology for operation of the hybrid transmitter of FIG. 2, in accordance with an embodiment of the present disclosure.

Figure 1:
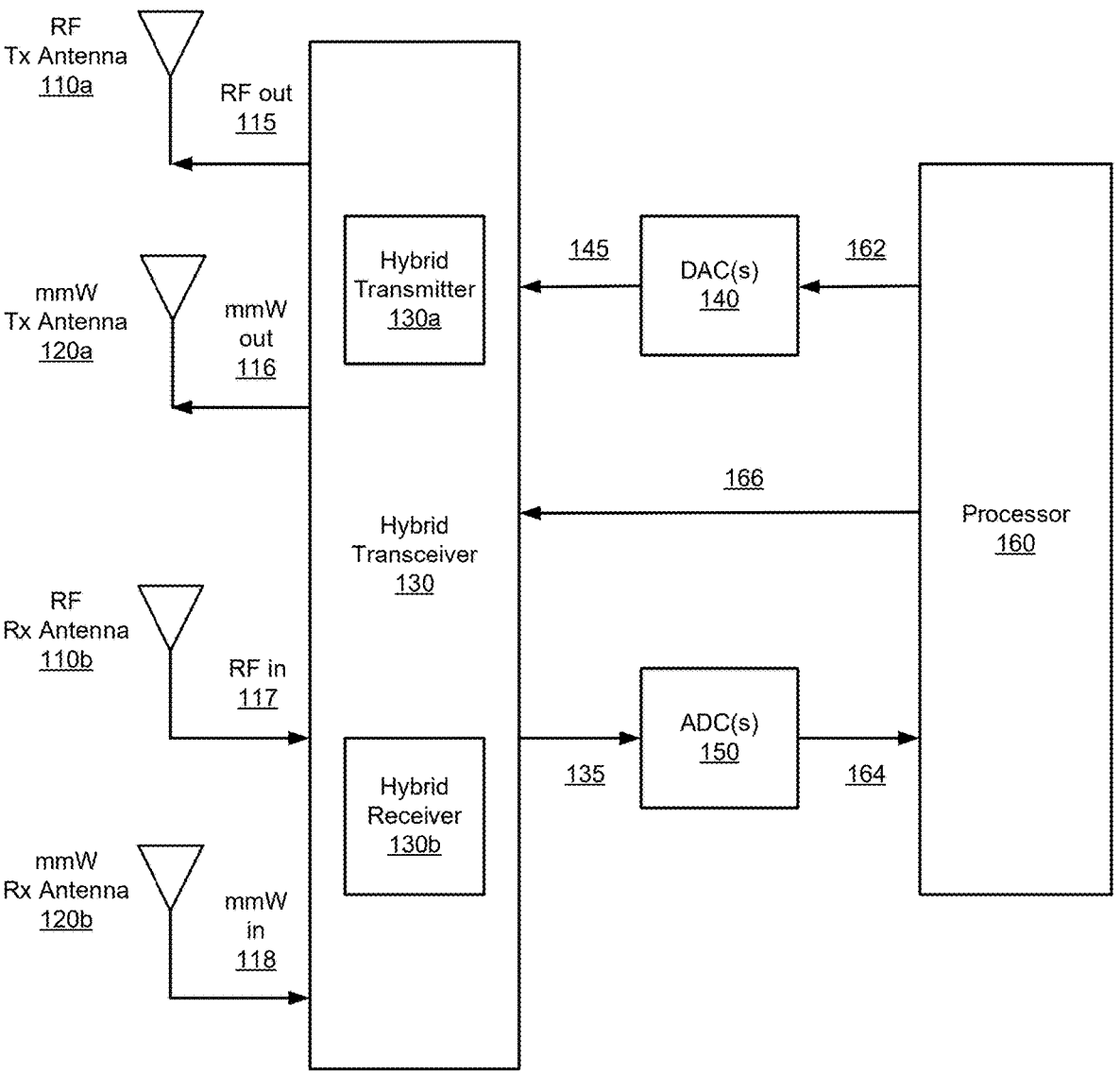
FIG. 1 is a block diagram of a transceiver platform, in accordance with certain embodiments of the present disclosure.

Although the following Detailed Description will proceed with reference being made to illustrative embodiments, many alternatives, modifications, and variations thereof will be apparent in light of this disclosure.

DETAILED DESCRIPTION

An adaptable hybrid transceiver architecture and methodology are described. As noted above, evolving threat environments are driving transceiver operational requirements to provide increased instantaneous bandwidth (IBW) and instantaneous dynamic range (IDR), to deal with increasingly advanced threats. Simultaneously, there is a desire to reduced size, weight, power consumption, and cost of the transceivers.

To this end, and in accordance with an embodiment of the present disclosure, a hybrid transceiver is disclosed which enables adaptable bandwidth selection ranging from full RF bandwidth and mmW bandwidth down to narrower IF bandwidths. The bandwidths may be dynamically selected based on the density of received signals (including blocking or jamming signals) and/or the presence of saturation in the analog to digital converters (ADCs). In some embodiments, the hybrid transceiver allows for simultaneous operation over a wideband (WB) region of the signal spectrum, for a more complete view of the environment, along with operation over narrower bands that can focus in on signals of interest by eliminating out-of-band signals and providing a lower noise floor that increases IDR.

In accordance with an embodiment, a hybrid transceiver system includes a receiver comprising a first-stage downconverter, a second-stage downconverter, and a downconverter bypass path. The first-stage downconverter is configured to convert a WB RF input analog signal to a first intermediate frequency (IF1) narrowband (NB) input analog signal, and the second-stage downconverter is configured to convert the IF1 NB input analog signal, or a millimeter wave (mmW) input analog signal, to a second intermediate frequency (IF2) NB input analog signal. The transceiver also includes one or more ADCs configured to convert one or more of the IF1 NB input analog signal, the IF2 NB input analog signal, and the RF input analog signal (via the downconverter bypass path) to digital input signals. The transceiver further includes a processor configured to control the first-stage downconverter to set a center frequency and bandwidth of the IF1 NB input analog signal, control the second-stage downconverter to set a center frequency and bandwidth of the IF2 NB input analog signal, and process the digital input signals. The transceiver further includes one or more digital to analog converters (DACs) configured to convert a digital output signal, generated by the processor, to one or more of a first NB output analog signal at IF1, an NB output analog signal at IF2, and a first WB RF output analog signal. The transceiver further includes a transmitter comprising a first-stage upconverter and a second-stage upconverter and an upconverter bypass path. The second-stage upconverter is configured to convert the IF2 NB output analog signal to a second NB output analog signal at IF1 or to a WB mmW output analog signal. The first-stage upconverter is configured to convert the first IF1 NB output analog signal or the second IF1 NB output analog signal to a second WB RF output analog signal. The processor is further configured to control the second-stage upconverter to set a center frequency and bandwidth of the IF1 NB output analog signal 215 or the mmW output analog signal, and control the first-stage upconverter to set a center frequency and bandwidth of the second WB RF output analog signal. Other examples may be configured differently.

It will be appreciated that the techniques described herein may provide improved transceiver operation with increased IBW and IDR, compared to other methods that employ direct digital conversion of the received signal by the ADC, which can result in high signal densities to the ADC which can saturate the ADC to cause blinding and masking of smaller signals, thus reducing the probability of detection and identification. Numerous embodiments and applications will be apparent in light of this disclosure.

System Architecture

FIG. 1 is a block diagram of a transceiver platform 100, in accordance with certain embodiments of the present disclosure. The transceiver platform 100 is shown to include an RF transmit antenna 110a, a mmW transmit antenna 120a, an RF receive antenna 110b, a mmW receive antenna 120b, a hybrid transceiver 130 (comprising a hybrid receiver 130a and a hybrid transmitter 130b), one or more DACs 140, one or more ADCs 150, and a processor 160.

The RF transmit antenna 110a may comprise one or more antennas that are configured to transmit RF signals (RF out 115) that are generated by the hybrid transceiver 130. The mmW transmit antenna 120a may comprise one or more antennas that are configured to transmit mmW signals (mmW out 116) that are generated by the hybrid transceiver 130.

The RF receive antenna 110b may comprise one or more antennas that are configured to receive RF signals (RF in 117). The mmW receive antenna 120b may comprise one or more antennas that are configured to receive mmW signals (mmW in 118).

In some embodiments, the RF transmit antenna 110a and the RF receive antenna 110b may comprise one or more shared antennas. In some embodiments, the mmW transmit antenna 120a and the mmW receive antenna 120b may comprise one or more shared antennas.

The hybrid transceiver 130 will be described in greater detail below, but at a high level, it serves as an RF front end and is configured to receive and transmit signals in both the RF frequency range and the mmW frequency range using dynamically selected wideband and narrowband tuning and filtering (e.g., up conversion and down conversion).

Wideband paths through the transceiver may provide the greatest probability of detection and identification of signals of interest resulting in improved situational awareness. The wideband paths, however, may also result in signal densities that are too high, resulting in missed detections, and/or possible saturation of the ADCs (e.g., blinding events). Narrowband paths through the transceiver can provide a more focused look at signals of interest by eliminating out-of-band signals and providing a lower noise floor (due to the narrower bandwidth) which increases IDR. In some embodiments, the transceiver allows for simultaneous wideband and narrowband operation.

The DACs 140 are configured to provide direct digital conversion of digital signals 162 (provided by the processor 160) to analog signals 145, over frequency ranges extending to 60 GHz. The resulting analog signals are routed to the transmitter 130a of the hybrid transceiver 130 for transmission as RF signals 115 or mmW signals 116.

The ADCs are configured to provide direct digital conversion of analog signals 135 to digital signals 164 over frequency ranges extending to 60 GHz. The analog signals are routed from the receiver 130b of the hybrid transceiver 130, and the resulting digital signals are provided to processor 160.

Operation of the processor 160 will be described in greater detail below, but at a high level, is the processor is configured to generate control signals 166 to control the hybrid transceiver 130, for example by selecting tuning frequencies and bandwidths for converter stages, and routing signals through one or more converter stages or bypassing the converter stages. The processor 160 may also be configured to analyze the received digitized signals 164 to search for and detect signals of interest and determine transmission responses if needed, based on the application.

Figure 2:
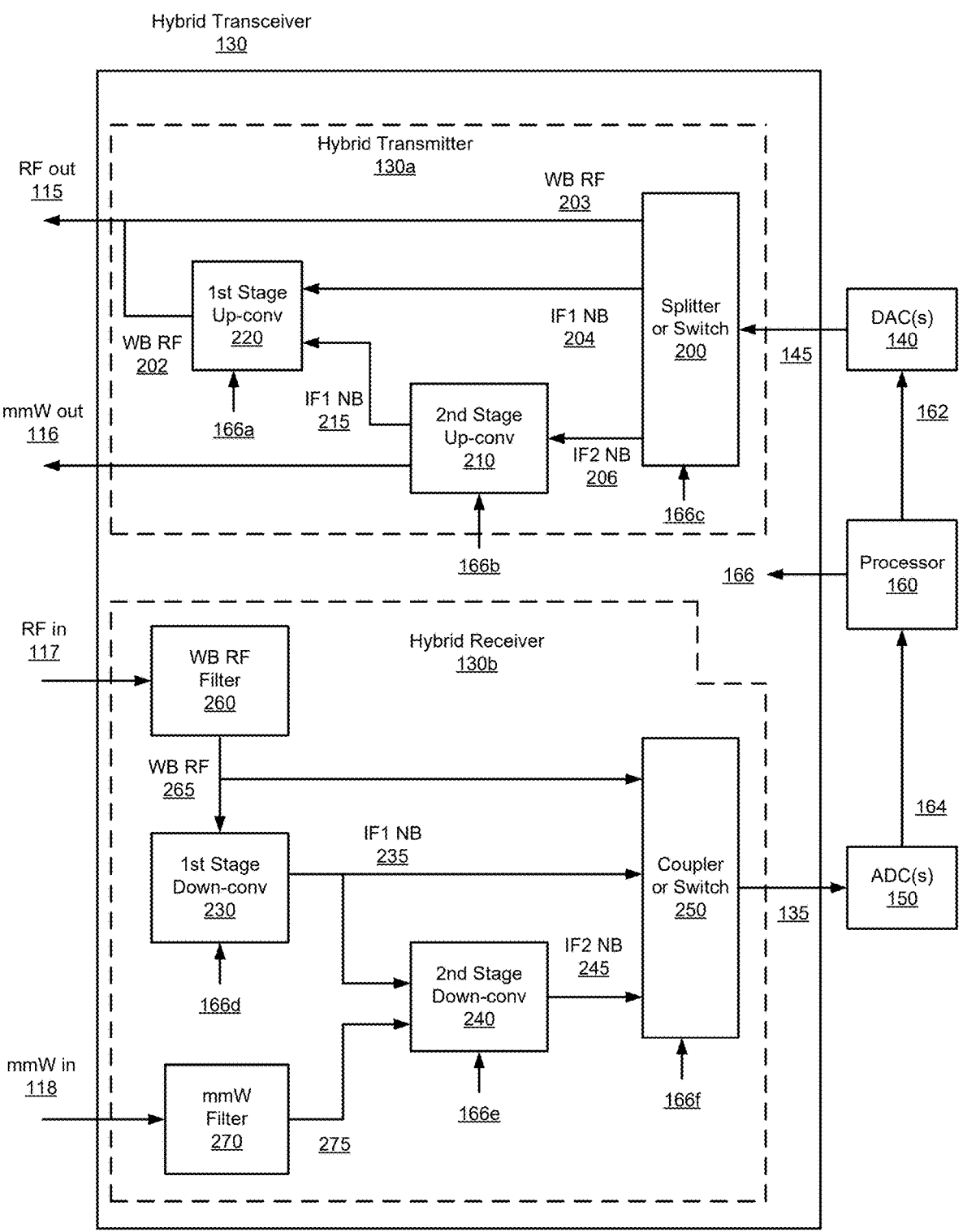
FIG. 2 is a block diagram of the hybrid transceiver of FIG. 1, configured in accordance with certain embodiments of the present disclosure.

FIG. 2 is a block diagram of the hybrid transceiver 130 of FIG. 1, configured in accordance with certain embodiments of the present disclosure. The hybrid transceiver 130 is shown to include a hybrid transmitter 130a and a hybrid receiver 130b.

Addressing the receiver portion first, the hybrid receiver 130b is shown to include a front end WB RF filter 260, a front end mmW filter 270, a first-stage downconverter 230, a second-stage downconverter 240, and a coupler or a switch 250.

The front end WB RF filter 260 is coupled to the RF receive antenna 110b and configured to filter the received RF signal 117 to an RF bandwidth to generate a WB RF input analog signal 265. In some embodiments, the RF bandwidth is in the range of 0.1 GHz to 20 GHz.

The front end mmW filter 270 is coupled to the mmW receive antenna 120b and configured to filter the received mmW signal 118 to an mmW bandwidth to generate the mmW input analog signal 275. In some embodiments, the mmW bandwidth is in the range of 20 GHz to 60 GHz.

The first-stage downconverter 230 is configured to convert the RF input analog signal 265 to the IF1 NB input analog signal 235. In some embodiments, the center frequency and IBW of the IF1 NB input analog 235 signal are set based on control signal 166d provided by processor 160. In some embodiments, the IF1 frequency can range from 20 GHz to 60 GHz.

The second-stage downconverter 240 is configured to convert the IF1 NB input analog signal 235 or the mmW input analog signal 275 to the IF2 NB input analog signal 245. In some embodiments, the center frequency and IBW of the IF2 NB input analog signal 245 are set based on control signal 166e provided by processor 160. In some embodiments, the IF2 frequency can range from 0.1 to 20 GHz.

The WB RF input analog signal 265 may also take a downconverter bypass path directly to the coupler/switch 250 as shown.

In some embodiments, for example if operational requirements (e.g., IBW and IDR) are relaxed and mmW coverage is not needed, the second-stage downconverter 240 may be omitted to reduce size, weight, power consumption, and cost.

In some embodiments, component 250 is a coupler and is configured to couple or route the RF input analog signal 265, the IF1 NB input analog signal 235, and/or the IF2 NB input analog signal 245 (collectively referenced as 135 in FIG. 2) to the one or more ADCs 150. In some embodiments, component 250 is a switch and is configured to switch the routing of either the RF input analog signal 265, the IF1 NB input analog signal 235, or the IF2 NB input analog signal 245 to the one or more ADCs 150, based on control signal 166f provided by processor 160. The one or more ADCs 150 are configured to convert one or more of the IF1 NB input analog signal 235, the IF2 NB input analog signal 245, and the RF input analog signal 265 (via the downconverter bypass path), to digital input signals 164 to be provided to the processor 160. Control of the routing or switching performed by component 250 is based on control signal 166f provided by processor 160, as will be explained in greater detail below.

Turning now to the transmitter portion, the hybrid transmitter 130a is shown to include a first-stage upconverter 220, a second-stage upconverter 210, and a splitter or a switch 200.

In some embodiments, component 200 is a splitter and is configured to split the output 145 of the DACs 140 to a first NB output analog signal at IF1 204, an NB output analog signal at IF2 206, and a first WB RF output analog signal 203. In some embodiments, component 200 is a switch and is configured to switch the routing of the output 145 of the DACs 140 to the IF1 NB output analog signal 204, the IF2 NB output analog signal 206, and the first WB RF output analog signal 203 (which bypasses the upconverters for transmission directly as the RF output analog signal 115). Control of the splitting or switching performed by component 200 is based on control signal 166c provided by processor 160, as will be explained in greater detail below.

The second-stage upconverter 210 is configured to convert the IF2 NB output analog signal 206 to a second IF1 NB output analog signal 215 or a mmW output analog signal 116. In some embodiments, the center frequency and IBW of the second IF1 NB output analog signal 215 are set based on control signal 166b provided by processor 160.

The first-stage upconverter 220 is configured to convert the first NB output analog signal at IF1 204 or second IF1 NB output analog signal 215 to second WB RF output analog signal 202 for transmission as the RF output analog signal 115. In some embodiments, the center frequency and IBW of the second WB RF output analog signal 202 are set based on control signal 166a provided by processor 160.

In some embodiments, for example if operational requirements (e.g., IBW and IDR) are relaxed and mmW coverage is not needed, the second-stage upconverter 210 may be omitted to reduce size, weight, power consumption, and cost.

Processor 160 is configured to control the receiver 130b and transmitter 130a through control signals 166. In some embodiments, processor 160 is configured to: (1) generate a first control signal 166e to select either the IF1 NB input analog signal 235 or the mmW input analog signal 275 for conversion by the second-stage downconverter 240; (2) generate a second control signal 166a to select either the IF1 NB output analog signal 204 or the second IF1 NB output analog signal 215 for conversion by the first-stage upconverter 220; and (3) generate a third control signal 166b to cause the second-stage upconverter 210 to either route the second IF1 NB output analog signal 215 to the first-stage upconverter 220 or to route the mmW output analog signal 116 to the mmW transmit antenna 120a.

In some embodiments, processor 160 is configured to: (1) analyze the digital input signals 164 to detect a density of signals exceeding a density threshold and to detect saturation of the one or more ADCs 150; (2) perform the control of the first-stage downconverter 230 based on the detected density and/or the detected saturation; (3) perform the control of the second-stage downconverter 240 based on the detected density and/or the detected saturation; and (4) generate the first control signal 166e based on the detected density and/or the detected saturation.

In some embodiments, processor 160 is further configured to: (1) perform the control of the first-stage upconverter 220 based on the detected density and/or the detected saturation; (2) perform the control of the second-stage upconverter 210 based on the detected density and/or the detected saturation; and (3) generate the second control signal 166a and the third control signal 166b based on the detected density and/or the detected saturation.

Operation of the processor 160 will be described in greater detail below in connection with FIG. 7.

Figure 3:
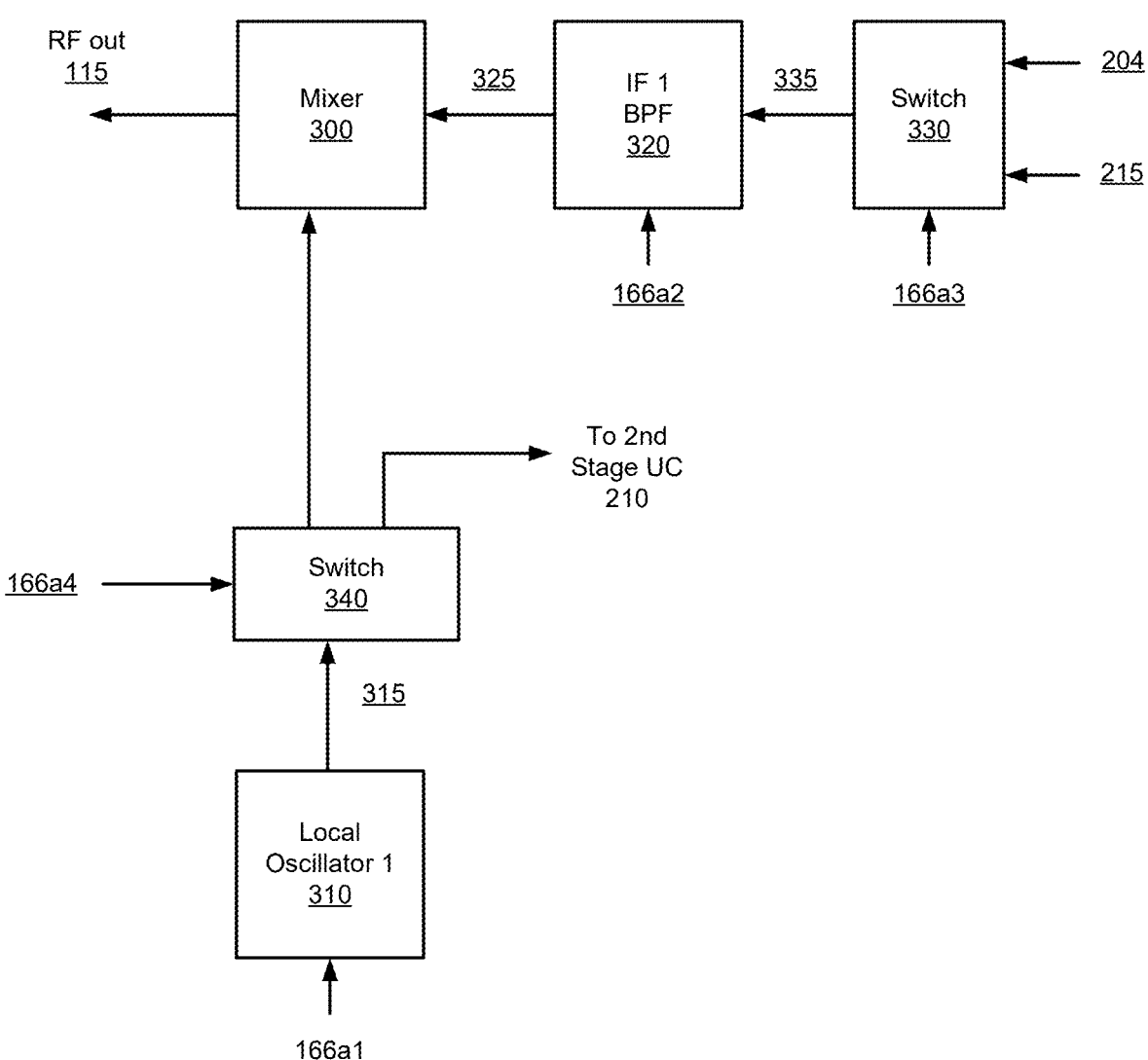
FIG. 3 is a block diagram of the first-stage upconverter of the hybrid transmitter of FIG. 2, configured in accordance with certain embodiments of the present disclosure.

FIG. 3 is a block diagram of the first-stage upconverter 220 of the hybrid transmitter 130a of FIG. 2, configured in accordance with certain embodiments of the present disclosure. The first-stage upconverter 220 is shown to include a first switch 330, an IF1 band pass filter (BPF) 320, a first local oscillator (LO) 310, a second switch 340, and a mixer 300.

The first switch 330 is configured to select between IF1 NB output analog signal 204 and the second IF1 NB output analog signal 215 based on the control signal 166a3 provided by the processor 160.

The IF1 BPF 320 is configured to apply a filter (e.g., a bandpass filter) to the output 335 of the switch 330. The bandwidth of the BPF is set by the control signal 166a2 provided by the processor 160. In some embodiments, the BPF 320 may be a filter bank comprising multiple band pass filters, any one of which may be selected by the processor to provide real-time adaptive narrow bandwidth selection, for example using control signal 166a2.

The First LO 310 is configured to generate a sinusoidal signal 315 at a center frequency set by the control signal 166a1 provided by the processor 160.

The second switch 340 is configured to route the LO1 signal 315 to either the mixer 300 or to the second-stage upconverter 210, based on control signal 166a4 provided by processor 160.

The Mixer 300 is configured to mix the sinusoidal signal 315 with the output 325 of the IF1 BPF 320 to generate the RF output analog signal 115.

Figure 4:
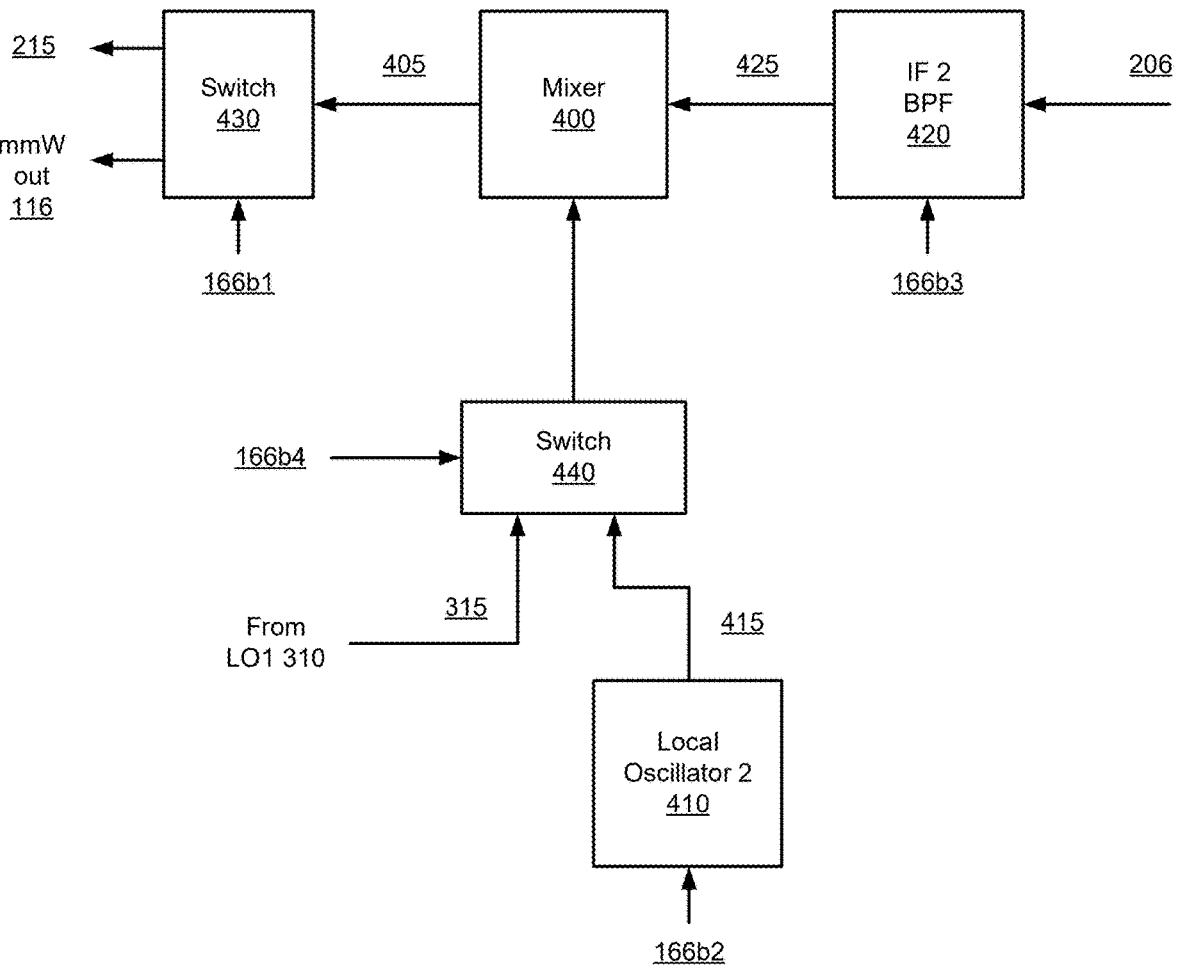
FIG. 4 is a block diagram of the second-stage upconverter of the hybrid transmitter of FIG. 2, configured in accordance with certain embodiments of the present disclosure.

FIG. 4 is a block diagram of the second-stage upconverter 210 of the hybrid transmitter 130a of FIG. 2, configured in accordance with certain embodiments of the present disclosure. The second-stage upconverter 210 is shown to include an IF2 BPF 420, a second LO 410, a mixer 400, a first switch 430, and a second switch 440.

The IF2 BPF 420 is configured to apply a filter (e.g., a bandpass filter) to the IF2 NB output analog signal 206. The bandwidth of the BPF is set by the control signal 166b3 provided by the processor 160. In some embodiments, the BPF 420 may be a filter bank comprising multiple band pass filters, any one of which may be selected by the processor to provide real-time adaptive narrow bandwidth selection, for example using control signal 166b3.

The second LO 410 is configured to generate a sinusoidal signal 415 at a center frequency set by the control signal 166b2 provided by the processor 160.

The switch 440 is configured to select either the LO2 signal 415 or the LO1 signal 315 (from the first-stage upconverter) based on control signal 166b4 provided by processor 160. The LO2 signal 415 may be chosen for generating the second IF1 NB output analog signal 215, while the LO1 signal 315 may be chosen for generating the mmW output analog signal 116.

The mixer 400 is configured to mix the sinusoidal signal (either 315 or 415) with the output 425 of the IF2 BPF 420 to generate an upconverted signal 405.

The switch 430 is configured to route the upconverted signal 405 to either the first-stage upconverter 220 (as the second IF1 NB output analog signal 215) or to the mmW transmit antenna 120a (as mmW output analog signal 116). The switch setting, or routing, is based on the control signal 166b1 provided by the processor 160.

Figure 5:
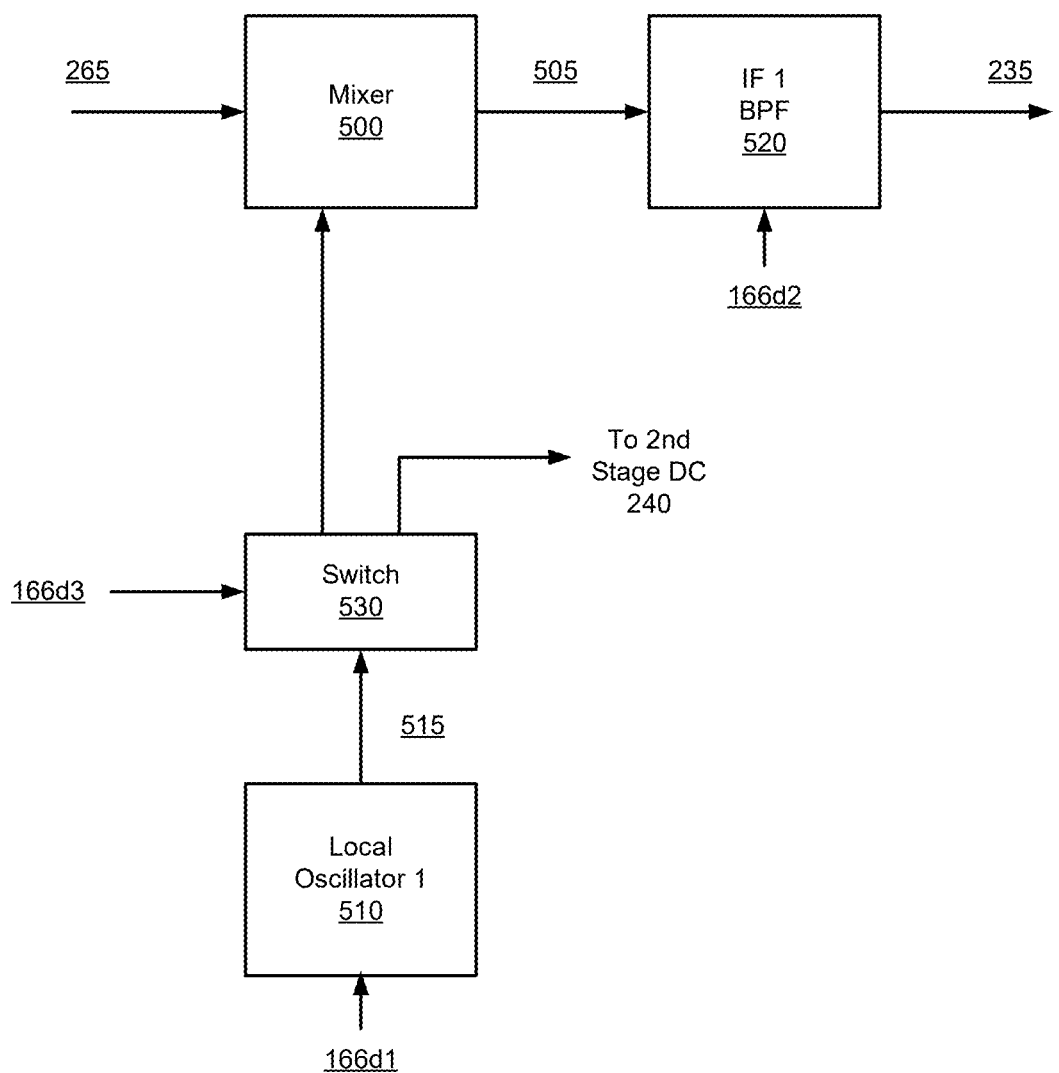
FIG. 5 is a block diagram of the first-stage downconverter of the hybrid receiver of FIG. 2, configured in accordance with certain embodiments of the present disclosure.

FIG. 5 is a block diagram of the first-stage downconverter 230 of the hybrid receiver 130b of FIG. 2, configured in accordance with certain embodiments of the present disclosure. The first-stage downconverter 230 is shown to include a first LO 510, a switch 530, a mixer 500, and an IF1 BPF 520.

The first LO 510 is configured to generate a sinusoidal signal 515 at a center frequency set by the control signal 166d1 provided by the processor 160. In some embodiments the first LO 510 may be shared with the first LO 310 of the first-stage upconverter.

The switch 530 is configured to route the LO1 signal 515 to either the mixer 500 or to the second-stage downconverter 240, based on control signal 166d3 provided by processor 160.

The mixer 500 is configured to mix the sinusoidal signal 515 with the RF input analog signal 265 to generate a down converted signal 505.

The IF1 BPF 520 is configured to apply a filter (e.g., a bandpass filter) to the down converted signal 505 to generate the IF1 NB input analog signal 235. The bandwidth of the BPF is set by the control signal 166d2 provided by the processor 160. In some embodiments, the BPF 520 may be a filter bank comprising multiple band pass filters, any one of which may be selected by the processor to provide real-time adaptive narrow bandwidth selection, for example using control signal 166d2.

Figure 6:
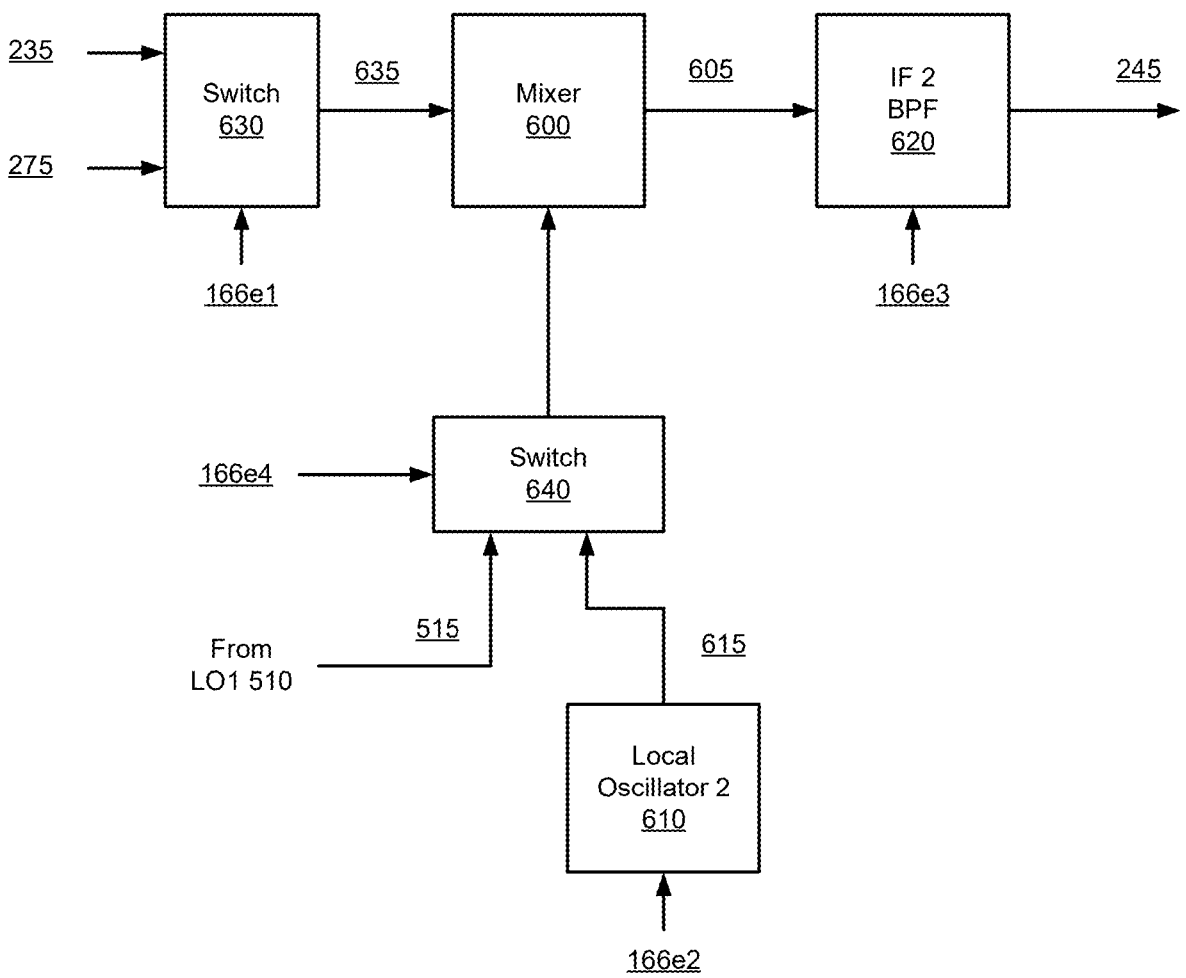
FIG. 6 is a block diagram of the second-stage downconverter of the hybrid receiver of FIG. 2, configured in accordance with certain embodiments of the present disclosure.

FIG. 6 is a block diagram of the second-stage downconverter 240 of the hybrid receiver 130b of FIG. 2, configured in accordance with certain embodiments of the present disclosure. The second-stage downconverter 240 is shown to include a first switch 630, a mixer 600, an IF2 BPF 620, a second LO 610, and a second switch 640.

The switch 630 is configured to select between the IF1 NB input analog signal 235 and the mmW input analog signal 275 based on the control signal 166e1 provided by the processor 160.

The second LO 610 is configured to generate a sinusoidal signal 615 at a center frequency set by the control signal 166e2 provided by the processor 160. In some embodiments the second LO 610 may be shared with the second LO 410 of the second-stage upconverter.

The switch 640 is configured to select either the LO2 signal 615 or the LO1 signal 515 (from the first-stage downconverter) based on control signal 166e4 provided by processor 160. The LO2 signal 615 may be chosen when the IF1 NB input analog signal 235 is selected by switch 630. The LO1 signal 515 may be chosen when the mmW input analog signal 275 is selected by switch 630.

The mixer 600 is configured to mix the sinusoidal signal (either 515 or 615) with the output 635 of switch 630 to generate a down converted signal 605.

The IF2 BPF 620 is configured to apply a filter (e.g., a bandpass filter) to the down converted signal 605 to generate the IF2 NB input analog signal 245. The bandwidth of the BPF is set by the control signal 166e3 provided by the processor 160. In some embodiments, the BPF 620 may be a filter bank comprising multiple band pass filters, any one of which may be selected by the processor to provide real-time adaptive narrow bandwidth selection, for example using control signal 166e3.

Figure 7:
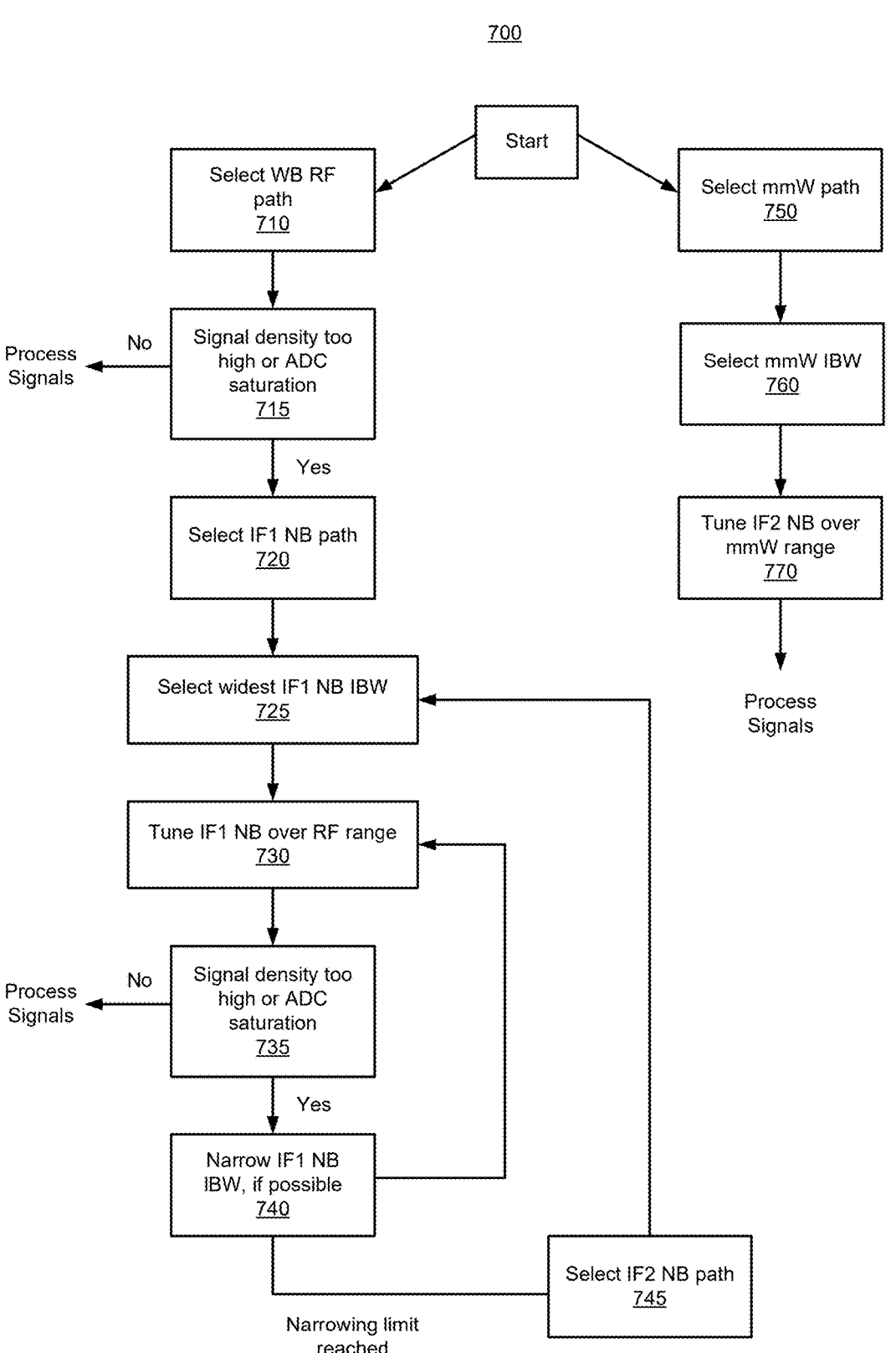
FIG. 7 is a logic flow diagram for operation of the processor of FIG. 2, in accordance with an embodiment of the present disclosure.

FIG. 7 is a logic flow diagram 700 for operation of the processor 160 of FIG. 2, in accordance with an embodiment of the present disclosure. The process begins by controlling the hybrid receiver 130b to select either the WB RF path, at operation 710, or the mmW path, at operation 750.

The WB RF path is the path that routes through the WB RF filter 260 and the coupler/switch 250 to the ADCs 150. To select the WB RF path, the processor controls the coupler/switch 250 to route the RF input analog signal 265 to the ADCs. The WB RF path may provide the greatest probability of detection and identification of signals of interest resulting in improved situational awareness. The WB RF path may also, however, result in signal densities that are too high, resulting in missed detections, and/or possible saturation of the ADCs (e.g., blinding events).

The mmW path is the path that routes through the mmW filter 270, the second-stage downconverter 240, and the coupler/switch 250 to the ADCs 150. To select the mmW path, the processor controls the second-stage downconverter 240 to select the mmW input analog signal 275 for down conversion, and then controls the coupler/switch 250 to route the IF2 NB input analog signal 245 to the ADCs 150. The mmW path may be selected if the signals of interest reside in the mmW band.

If the WB RF path was selected, then at operation 715, the processor analyzes the digital signals 164 to determine if the signal density is too high to manage (e.g., the density exceeds a threshold) or if the ADCs have saturated. If neither of these conditions is true, then the signals may be further analyzed and processed in any suitable manner dependent on the application. Otherwise, the processor proceeds to operation 720.

At operation 720, the IF1 NB path is selected, which is the path that routes from the WB RF filter 260 through the first-stage downconverter 230 and the coupler/switch 250 to the ADCs 150. To select the IF1 NB path, the processor controls the coupler/switch 250 to route the IF1 NB input analog signal 235 to the ADCs.

At operation 725, the processor selects the widest bandwidth (from a range of available bandwidths) as the current IBW for the first-stage downconverter 230.

At operation 730, the processor tunes the first-stage downconverter 230 through a desired frequency range at the currently selected IBW. In some embodiments, the desired frequency range may include the entire RF frequency range.

At each step through the tuning range (e.g., the current tuning frequency and IBW), at operation 735, the processor analyzes the digital signals 164 to determine if the signal density is too high or if the ADCs have saturated. If neither of these conditions is true, then the signals may be further analyzed and processed in any suitable manner dependent on the application. Otherwise, the processor proceeds to operation 740.

At operation 740, the processor narrows the bandwidth (e.g., to a next smaller bandwidth from the range of available bandwidths) for use as the current IBW for the first-stage downconverter 230 and the process loops back to operation 730.

If a narrower bandwidth is not possible (e.g., the range of available bandwidths has been exhausted for the first-stage downconverter), then the process continues, at operation 745, in which the IF2 NB path is selected. The IF2 NB path provides further narrowing and routes from the WB RF filter 260 through the first-stage downconverter 230, the second-stage downconverter 240, and the coupler/switch 250 to the ADCs 150. To select the IF2 NB path, the processor controls the coupler/switch 250 to route the IF2 NB input analog signal 245 to the ADCs. The process then loops back to operation 725 to begin again at the widest IF1 NB bandwidth, but now routing the signals through the IF2 NB path.

Returning to operation 750, if the mmW path was selected, then at operation 760, the processor selects a desired mmW bandwidth for the second-stage downconverter 240.

At operation 770, the processor tunes the second-stage downconverter 240 through the mmW frequency range and processes the signals in any suitable manner dependent on the application.

The processor may determine transmit response signals based on analysis of the received signals (e.g., searching, detecting, assessing signals of interest). In some embodiments, the transmit path may be selected to match the receive path. For example, if the mmW path was selected for the receive path, then the transmit path may be routed through the second-stage upconverter 210. Similarly, if the WB RF path was selected for the receive path, then the transmit path may be routed directly to the RF transmit antennas 110a, bypassing the upconverters 210 and 220. Likewise, if the receive signal is routed through only the first-stage downconverter 230, the transmit path may be routed through only the first-stage upconverter 220. And, if the if the receive signal is routed through both the first-stage downconverter 230 and the second-stage downconverter 240, the transmit path may be routed through both the first-stage upconverter 220 and the second-stage upconverter 210.

Methodology

FIG. 8 is a flowchart illustrating a methodology 800 for operation of the hybrid receiver 130b of FIG. 2, in accordance with an embodiment of the present disclosure. FIG. 9 is a flowchart illustrating a methodology 900 for operation of the hybrid transmitter 130a of FIG. 2, in accordance with an embodiment of the present disclosure.

As can be seen, example methods 800 and 900 includes a number of phases and sub-processes, the sequence of which may vary from one embodiment to another. However, when considered in aggregate, these phases and sub-processes form a process for operation of hybrid transceiver 130, in accordance with certain of the embodiments disclosed herein, for example as illustrated in FIGS. 1-7, as described above. However other system architectures can be used in other embodiments, as will be apparent in light of this disclosure. To this end, the correlation of the various functions shown in FIGS. 8 and 9 to the specific components illustrated in the figures, is not intended to imply any structural and/or use limitations. Rather other embodiments may include, for example, varying degrees of integration wherein multiple functionalities are effectively performed by one system. Numerous variations and alternative configurations will be apparent in light of this disclosure.

In one embodiment, method 800 for operation of the hybrid receiver 130b commences, at operation 810, by converting, via a first-stage downconverter, an RF input analog signal to a first IF1 NB input analog signal. In some embodiments, a received RF signal is filtered to a desired RF bandwidth to generate the RF input analog signal. In some embodiments, the desired RF bandwidth may be in the range of 0.1 GigaHertz (GHz) to 20 GHz.

At operation 820, the method continues by converting, via a second-stage downconverter, the IF1 NB input analog signal or a mmW input analog signal to a second IF2 NB input analog signal. In some embodiments, a received mmW signal is filtered to a desired mmW bandwidth to generate the mmW input analog signal. In some embodiments, the desired mmW bandwidth may be in the range of 20 GigaHertz (GHz) to 60 GHz.

At operation 830, the method continues by converting, via one or more ADCs, one or more of the IF1 NB input analog signal, the IF2 NB input analog signal, and the RF input analog signal to digital input signals.

At operation 840, the first-stage downconverter is controlled, for example by the processor, to set a center frequency and IBW of the IF1 NB input analog signal.

At operation 850, the second-stage downconverter is controlled, for example by the processor, to set a center frequency and IBW of the IF2 NB input analog signal.

In some embodiments, additional operations may be performed, as previously described in connection with the system. For example, a first control signal may be generated by the processor to select either the IF1 NB input analog signal or the mmW input analog signal for conversion by the second-stage downconverter.

In some embodiments, the digital input signals may be analyzed to detect a density of signals exceeding a density threshold and/or to detect saturation of the one or more ADCs. The first-stage downconverter and the second-stage downconverter may then be controlled based on the detected density and/or the detected saturation. Generation of the first control signal may also be based on the detected density and/or the detected saturation.

In one embodiment, method 900 for operation of the hybrid transmitter 130a commences, at operation 910, by converting, via one or more DACs, a digital output signal to one or more of a first NB output analog signal at IF1, an NB output analog signal at IF2, and a first WB RF output analog signal.

At operation 920, the method continues by converting, via a second-stage upconverter, the IF2 NB output analog signal to a second NB output analog signal at IF1 or to a WB mmW output analog signal.

At operation 930, the method continues by converting, via a first-stage upconverter, the first IF1 NB output analog signal or the second IF1 NB output analog signal to a second WB RF output analog signal.

At operation 940, the second-stage upconverter is controlled, for example by the processor, to set a center frequency and IBW of the IF1 NB output analog signal 215 or the mmW output analog signal.

At operation 950, the first-stage upconverter is controlled, for example by the processor, to set a center frequency and IBW of the second WB RF output analog signal.

In some embodiments, a second control signal may be generated by the processor to select either the first IF1 NB output analog signal or the second IF1 NB output analog signal for conversion by the first-stage upconverter. In some embodiments, a third control signal may be generated by the processor to cause the second-stage upconverter to either route the second NB output analog signal at IF1 to the first-stage upconverter or to route the mmW output analog signal to a mmW transmit antenna.

In some embodiments, the first-stage upconverter and the second-stage upconverter may be controlled based on the detected density and/or the detected saturation. Generation of the second and third control signals may also be based on the detected density and/or the detected saturation.

Example System

Figure 10:
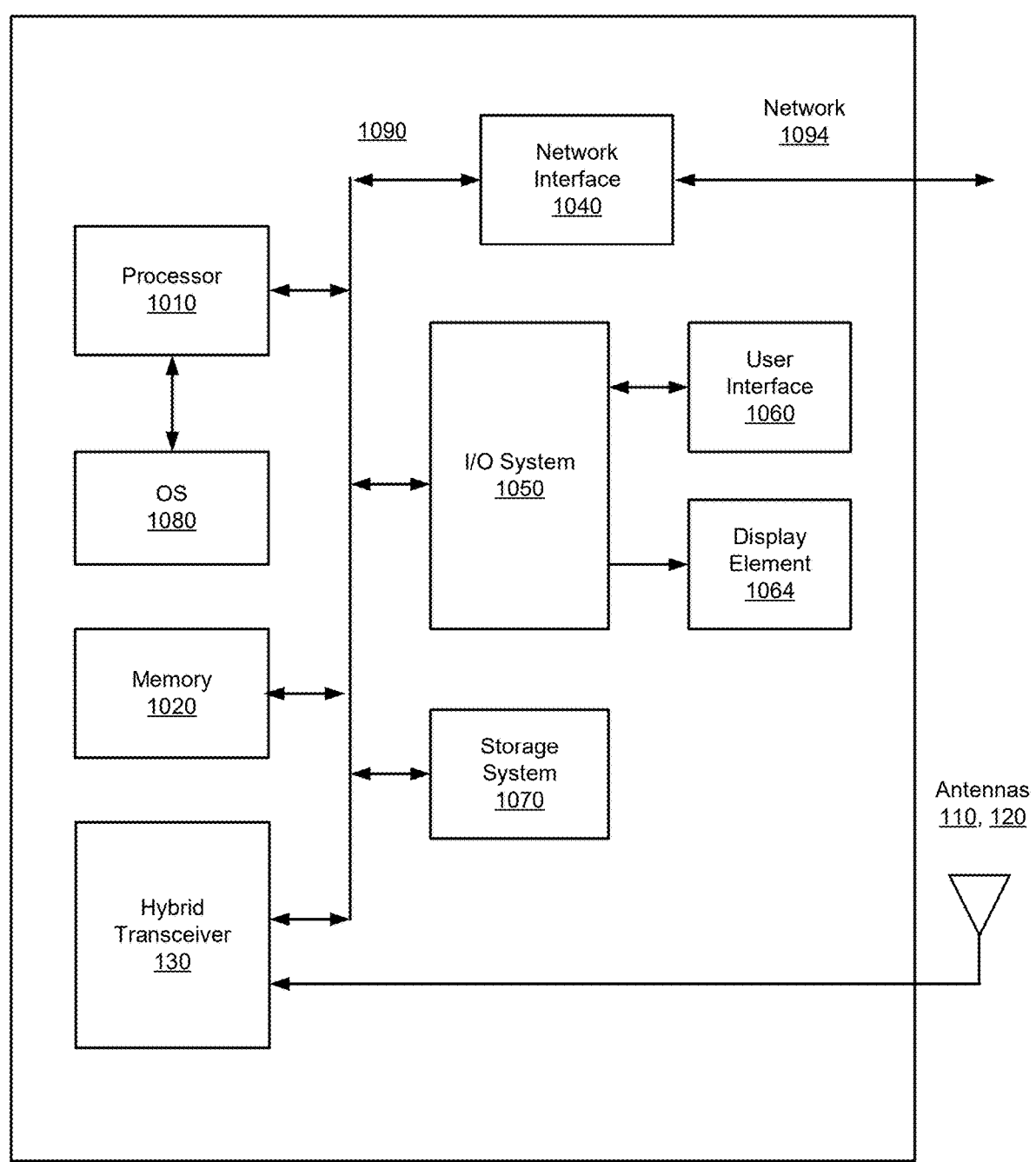
FIG. 10 is a block diagram of a processing platform configured to operate the hybrid transceiver of FIG. 2, in accordance with an embodiment of the present disclosure.

FIG. 10 is a block diagram of a processing platform 1000 configured to operate the hybrid transceiver 130 of FIG. 2, in accordance with an embodiment of the present disclosure. In some embodiments, platform 1000, or portions thereof, may be hosted on, or otherwise be incorporated into the electronic systems of an aircraft, ship, ground station, or man-portable system deployment.

In some embodiments, platform 1000 may comprise any combination of a processor 1010, memory 1020, a network interface 1040, an input/output (I/O) system 1050, a user interface 1060, a display element 1064, a storage system 1070, hybrid transceiver 130, and antennas 110, 120. As can be further seen, a bus and/or interconnect 1090 is also provided to allow for communication between the various components listed above and/or other components not shown. Platform 1000 can be coupled to a network 1094 through network interface 1040 to allow for communications with other computing devices, platforms, devices to be controlled, or other resources. Other componentry and functionality not reflected in the block diagram of FIG. 10 will be apparent in light of this disclosure, and it will be appreciated that other embodiments are not limited to any particular hardware configuration.

Processor 1010 can be any suitable processor, and may include one or more coprocessors or controllers, such as an audio processor, a graphics processing unit, or hardware accelerator, to assist in the execution of mission software and/or any communication, control and processing operations associated with platform 1000, including operation of the hybrid transceiver 130. In some embodiments, the processor 1010 may be implemented as any number of processor cores. The processor (or processor cores) may be any type of processor, such as, for example, a micro-processor, an embedded processor, a digital signal processor (DSP), a graphics processor (GPU), a tensor processing unit (TPU), a network processor, a field programmable gate array or other device configured to execute code. The processors may be multithreaded cores in that they may include more than one hardware thread context (or "logical processor") per core. Processor 1010 may be implemented as a complex instruction set computer (CISC) or a reduced instruction set computer (RISC) processor. In some embodiments, processor 1010 may be configured as an x86 instruction set compatible processor.

Memory 1020 can be implemented using any suitable type of digital storage including, for example, flash memory and/or random access memory (RAM). In some embodiments, the memory 1020 may include various layers of memory hierarchy and/or memory caches as are known to those of skill in the art. Memory 1020 may be implemented as a volatile memory device such as, but not limited to, a RAM, dynamic RAM (DRAM), or static RAM (SRAM) device. Storage system 1070 may be implemented as a non-volatile storage device such as, but not limited to, one or more of a hard disk drive (HDD), a solid-state drive (SSD), a universal serial bus (USB) drive, an optical disk drive, tape drive, an internal storage device, an attached storage device, flash memory, battery backed-up synchronous DRAM (SDRAM), and/or a network accessible storage device.

Processor 1010 may be configured to execute an Operating System (OS) 1080 which may comprise any suitable operating system, such as Google Android (Google Inc., Mountain View, CA), Microsoft Windows (Microsoft Corp., Redmond, WA), Apple OS X (Apple Inc., Cupertino, CA), Linux, or a real-time operating system (RTOS). As will be appreciated in light of this disclosure, the techniques provided herein can be implemented without regard to the particular operating system provided in conjunction with platform 1000, and therefore may also be implemented using any suitable existing or subsequently-developed platform.

Network interface circuit 1040 can be any appropriate network chip or chipset which allows for wired and/or wireless connection between other components of platform 1000 and/or network 1094, thereby enabling platform 1000 to communicate with other local and/or remote computing systems, and/or other resources. Wired communication may conform to existing (or yet to be developed) standards, such as, for example, Ethernet. Wireless communication may conform to existing (or yet to be developed) standards, such as, for example, cellular communications including LTE (Long Term Evolution) and 5G, Wireless Fidelity (Wi-Fi), Bluetooth, and/or Near Field Communication (NFC). Exemplary wireless networks include, but are not limited to, wireless local area networks, wireless personal area networks, wireless metropolitan area networks, cellular networks, and satellite networks.

I/O system 1050 may be configured to interface between various I/O devices and other components of platform 1000. I/O devices may include, but not be limited to, user interface 1060 and display element 1064. User interface 1060 may include devices (not shown) such as a touchpad, cockpit display unit, keyboard, and mouse, etc., for example, to allow the user to control the system. Display element 1064 may be configured to display information to a user. I/O system 1050 may include a graphics subsystem configured to perform processing of images for rendering on the display element 1064. Graphics subsystem may be a graphics processing unit or a visual processing unit (VPU), for example. An analog or digital interface may be used to communicatively couple graphics subsystem and the display element. For example, the interface may be any of a high definition multimedia interface (HDMI), DisplayPort, wireless HDMI, and/or any other suitable interface using wireless high definition compliant techniques. In some embodiments, the graphics subsystem could be integrated into processor 1010 or any chipset of platform 1000.

It will be appreciated that in some embodiments, the various components of platform 1000 may be combined or integrated in a system-on-a-chip (SoC) architecture. In some embodiments, the components may be hardware components, firmware components, software components or any suitable combination of hardware, firmware, or software.

Hybrid transceiver 130 is configured to provide dynamically selectable receiving and transmitting paths for direct digital conversion of RF wideband, narrowband, and millimeter wave signals, as described previously. Hybrid transceiver 130 may include any or all of the circuits/components illustrated in FIGS. 1-6, as described above. These components can be implemented or otherwise used in conjunction with a variety of suitable software and/or hardware that is coupled to or that otherwise forms a part of platform 1000. These components can additionally or alternatively be implemented or otherwise used in conjunction with user I/O devices that are capable of providing information to, and receiving information and commands from, a user.

In various embodiments, platform 1000 may be implemented as a wireless system, a wired system, or a combination of both. When implemented as a wireless system, platform 1000 may include components and interfaces suitable for communicating over a wireless shared media, such as one or more antennae, transmitters, receivers, transceivers, amplifiers, filters, control logic, and so forth. An example of wireless shared media may include portions of a wireless spectrum, such as the radio frequency spectrum and so forth. When implemented as a wired system, platform 1000 may include components and interfaces suitable for communicating over wired communications media, such as input/output adapters, physical connectors to connect the input/output adaptor with a corresponding wired communications medium, a network interface card (NIC), disc controller, video controller, audio controller, and so forth. Examples of wired communications media may include a wire, cable metal leads, printed circuit board (PCB), backplane, switch fabric, semiconductor material, twisted pair wire, coaxial cable, fiber optics, and so forth.

Various embodiments may be implemented using hardware elements, software elements, or a combination of both. Examples of hardware elements may include processors, microprocessors, circuits, circuit elements (for example, transistors, resistors, capacitors, inductors, and so forth), integrated circuits, ASICs, programmable logic devices, digital signal processors, FPGAs, logic gates, registers, semiconductor devices, chips, microchips, chipsets, and so forth. Examples of software may include software components, programs, applications, computer programs, application programs, system programs, machine programs, operating system software, middleware, firmware, software modules, routines, subroutines, functions, methods, procedures, software interfaces, application program interfaces, instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power level, heat tolerances, processing cycle budget, input data rates, output data rates, memory resources, data bus speeds, and other design or performance constraints.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still cooperate or interact with each other.

The various embodiments disclosed herein can be implemented in various forms of hardware, software, firmware, and/or special purpose processors. For example, in one embodiment at least one non-transitory computer readable storage medium has instructions encoded thereon that, when executed by one or more processors, cause one or more of the methodologies disclosed herein to be implemented. The instructions can be encoded using a suitable programming language, such as C, C++, object oriented C, Java, JavaScript, Visual Basic .NET, Beginner's All-Purpose Symbolic Instruction Code (BASIC), or alternatively, using custom or proprietary instruction sets. The instructions can be provided in the form of one or more computer software applications and/or applets that are tangibly embodied on a memory device, and that can be executed by a computer having any suitable architecture. In one embodiment, the system can be hosted on a given website and implemented, for example, using JavaScript or another suitable browser-based technology. For instance, in certain embodiments, the system may leverage processing resources provided by a remote computer system accessible via network 1094. The computer software applications disclosed herein may include any number of different modules, sub-modules, or other components of distinct functionality, and can provide information to, or receive information from, still other components. These modules can be used, for example, to communicate with input and/or output devices such as a display screen, a touch sensitive surface, a printer, and/or any other suitable device. Other componentry and functionality not reflected in the illustrations will be apparent in light of this disclosure, and it will be appreciated that other embodiments are not limited to any particular hardware or software configuration. Thus, in other embodiments platform 1000 may comprise additional, fewer, or alternative subcomponents as compared to those included in the example embodiment of FIG. 10.

The aforementioned non-transitory computer readable medium may be any suitable medium for storing digital information, such as a hard drive, a server, a flash memory, and/or random-access memory (RAM), or a combination of memories. In alternative embodiments, the components and/or modules disclosed herein can be implemented with hardware, including gate level logic such as a field-programmable gate array (FPGA), or alternatively, a purpose-built semiconductor such as an application-specific integrated circuit (ASIC). Still other embodiments may be implemented with a microcontroller having a number of input/output ports for receiving and outputting data, and a number of embedded routines for carrying out the various functionalities disclosed herein. It will be apparent that any suitable combination of hardware, software, and firmware can be used, and that other embodiments are not limited to any particular system architecture.

Some embodiments may be implemented, for example, using a machine readable medium or article which may store an instruction or a set of instructions that, if executed by a machine, may cause the machine to perform a method, process, and/or operations in accordance with the embodiments. Such a machine may include, for example, any suitable processing platform, computing platform, computing device, processing device, computing system, processing system, computer, process, or the like, and may be implemented using any suitable combination of hardware and/or software. The machine readable medium or article may include, for example, any suitable type of memory unit, memory device, memory article, memory medium, storage device, storage article, storage medium, and/or storage unit, such as memory, removable or non-removable media, erasable or non-erasable media, writeable or rewriteable media, digital or analog media, hard disk, floppy disk, compact disk read only memory (CD-ROM), compact disk recordable (CD-R) memory, compact disk rewriteable (CD-RW) memory, optical disk, magnetic media, magneto-optical media, removable memory cards or disks, various types of digital versatile disk (DVD), a tape, a cassette, or the like. The instructions may include any suitable type of code, such as source code, compiled code, interpreted code, executable code, static code, dynamic code, encrypted code, and the like, implemented using any suitable high level, low level, object oriented, visual, compiled, and/or interpreted programming language.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical entities within the registers, memory units, or other such information storage transmission or displays of the computer system. The embodiments are not limited in this context.

The terms "circuit" or "circuitry," as used in any embodiment herein, are functional and may comprise, for example, singly or in any combination, hardwired circuitry, programmable circuitry such as computer processors comprising one or more individual instruction processing cores, state machine circuitry, and/or firmware that stores instructions executed by programmable circuitry. The circuitry may include a processor and/or controller configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads, etc., in a hierarchical fashion. Firmware may be embodied as code, instructions or instruction sets and/or data that are hard-coded (e.g., nonvolatile) in memory devices. The circuitry may, collectively or individually, be embodied as circuitry that forms part of a larger system, for example, an integrated circuit (IC), an application-specific integrated circuit (ASIC), a system-on-a-chip (SoC), desktop computers, laptop computers, tablet computers, servers, smartphones, etc. Other embodiments may be implemented as software executed by a programmable control device. In such cases, the terms "circuit" or "circuitry" are intended to include a combination of software and hardware such as a programmable control device or a processor capable of executing the software. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Numerous specific details have been set forth herein to provide a thorough understanding of the embodiments. It will be understood, however, that other embodiments may be practiced without these specific details, or otherwise with a different set of details. It will be further appreciated that the specific structural and functional details disclosed herein are representative of example embodiments and are not necessarily intended to limit the scope of the present disclosure. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

Further Example Embodiments

The following examples pertain to further embodiments, from which numerous permutations and configurations will be apparent.

Example 1 is a transceiver system comprising: a receiver, one or more analog to digital converters (ADCs), and a processor. The receiver includes a first-stage downconverter configured to convert a radio frequency (RF) input analog signal to a first intermediate frequency (IF1) narrowband (NB) input analog signal, and a second-stage downconverter configured to convert the IF1 NB input analog signal or a millimeter wave (mmW) input analog signal to a second intermediate frequency (IF2) NB input analog signal. The one or more ADCs is (are) configured to convert one or more of the IF1 NB input analog signal, the IF2 NB input analog signal, and the RF input analog signal to digital input signals. The processor is configured to control the first-stage downconverter to set a center frequency and bandwidth of the IF1 NB input analog signal and control the second-stage downconverter to set a center frequency and bandwidth of the IF2 NB input analog signal.

Example 2 includes the system of Example 1, and further includes: one or more digital to analog converters (DACs) configured to convert a digital output signal to one or more of a first IF1 NB output analog signal, an IF2 NB output analog signal, and a first RF output analog signal. In some such examples, the system further includes a transmitter comprising a second-stage upconverter configured to convert the IF2 NB output analog signal to a second IF1 NB output analog signal or to a mmW output analog signal, and a first-stage upconverter configured to convert the first IF1 NB output analog signal or the second IF1 NB output analog signal to a second RF output analog signal. In some such examples, the processor is configured to control the second-stage upconverter to set a center frequency and bandwidth of the IF1 NB output analog signal or the mmW output analog signal and control the first-stage upconverter to set a center frequency and bandwidth of the second RF output analog signal.

Example 3 includes the system of Example 1 or 2, and further includes: an RF receive antenna configured to receive an RF signal; an RF wideband (WB) filter coupled to the RF receive antenna and configured to filter the received RF signal to an RF bandwidth to generate the RF input analog signal; a mmW receive antenna configured to receive a mmW signal; and a mmW filter coupled to the mmW receive antenna and configured to filter the received mmW signal to an mmW bandwidth to generate the mmW input analog signal.

Example 4 includes the system of Example 3, wherein the RF bandwidth is in a range of 0.1 GigaHertz (GHz) to 20 GHz, and the mmW bandwidth is in a range of 20 GHz to 60 GHz.

Example 5 includes the system of any one of Examples 1 through 4, wherein the processor is configured to: generate a first control signal to select either the IF1 NB input analog signal or the mmW input analog signal for conversion by the second-stage downconverter; generate a second control signal to select either the IF1 NB output analog signal or the second IF1 NB output analog signal for conversion by the first-stage upconverter; and generate a third control signal to cause the second-stage upconverter to either route the second IF1 NB output analog signal to the first-stage upconverter or to route the mmW output analog signal to the mmW transmit antenna.

Example 6 includes the system of any one of Examples 1 through 5, wherein the processor is configured to: analyze the digital input signals to detect a density of signals exceeding a density threshold and to detect saturation of the one or more ADCs; control the first-stage downconverter based on the detected density and/or the detected saturation; control the second-stage downconverter based on the detected density and/or the detected saturation; and/or generate the first control signal based on the detected density and/or the detected saturation.

Example 7 includes the system of Example 6, wherein the processor is configured to: control the first-stage upconverter based on the detected density and/or the detected saturation; control the second-stage upconverter based on the detected density and/or the detected saturation; and generate the second control signal and the third control signal based on the detected density and/or the detected saturation. In still other examples, the processor may be configured to perform any sub-combination of the functions recited in Examples 5 through 7, including one or more of the recited functions.

Example 8 is a method for operating a transceiver, the method comprising: converting, via a first-stage downconverter, a radio frequency (RF) input analog signal to a first intermediate frequency (IF1) narrowband (NB) input analog signal; converting, via a second-stage downconverter, the IF1 NB input analog signal or a millimeter wave (mmW) input analog signal to a second intermediate frequency (IF2) NB input analog signal; converting, via one or more analog to digital converters (ADCs), one or more of the IF1 NB input analog signal, the IF2 NB input analog signal, and the RF input analog signal to digital input signals; controlling the first-stage downconverter to set a center frequency and bandwidth of the IF1 NB input analog signal; and controlling the second-stage downconverter to set a center frequency and bandwidth of the IF2 NB input analog signal.

Example 9 includes the method of Example 8, the method further including: converting, via one or more digital to analog converters (DACs), a digital output signal to one or more of a first IF1 NB output analog signal, an IF2 NB output analog signal, and a first RF output analog signal; converting, via a second-stage upconverter, the IF2 NB output analog signal to a second IF1 NB output analog signal or to a mmW output analog signal; converting, via a first-stage upconverter, the first IF1 NB output analog signal or the second IF1 NB output analog signal to a second RF output analog signal; controlling the second-stage upconverter to set a center frequency and bandwidth of the IF1 NB output analog signal or the mmW output analog signal; and controlling the first-stage upconverter to set a center frequency and bandwidth of the second RF output analog signal.

Example 10 includes the method of Example 8 or 9, the method further including: filtering a received RF signal to an RF bandwidth to generate the RF input analog signal; and filtering a received mmW signal to an mmW bandwidth to generate the mmW input analog signal.

Example 11 includes the method of Example 10, wherein the RF bandwidth is in a range of 0.1 GigaHertz (GHz) to 20 GHz, and the mmW bandwidth is in a range of 20 GHz to 60 GHz.

Example 12 includes the method of any one of Examples 8 through 11, the method further including: generating a first control signal to select either the IF1 NB input analog signal or the mmW input analog signal for conversion by the second-stage downconverter; generating a second control signal to select either the IF1 NB output analog signal or the second IF1 NB output analog signal for conversion by the first-stage upconverter; and generating a third control signal to cause the second-stage upconverter to either route the second IF1 NB output analog signal to the first-stage upconverter or to route the mmW output analog signal to the mmW transmit antenna.

Example 13 includes the method of any one of Examples 8 through 12, the method further including: analyzing the digital input signals to detect a density of signals exceeding a density threshold and to detect saturation of the one or more ADCs; controlling the first-stage downconverter based on the detected density and/or the detected saturation; controlling the second-stage downconverter based on the detected density and/or the detected saturation; and/or generating the first control signal based on the detected density and/or the detected saturation.

Example 14 includes the method of Example 13, the method further including: controlling the first-stage upconverter based on the detected density and/or the detected saturation; controlling the second-stage upconverter based on the detected density and/or the detected saturation; and generating the second control signal and the third control signal based on the detected density and/or the detected saturation. In still other examples, the method may include any sub-combination of the functions recited in Examples 12 through 14, including one or more of the recited functions.

Example 15 is a computer program product including one or more non-transitory machine-readable mediums encoded with instructions that when executed by one or more processors cause a process to be carried out for operating a transceiver, the process comprising: converting, via a first-stage downconverter, a radio frequency (RF) input analog signal to a first intermediate frequency (IF1) narrowband (NB) input analog signal; converting, via a second-stage downconverter, the IF1 NB input analog signal or a millimeter wave (mmW) input analog signal to a second intermediate frequency (IF2) NB input analog signal; converting, via one or more analog to digital converters (ADCs), one or more of the IF1 NB input analog signal, the IF2 NB input analog signal, and the RF input analog signal to digital input signals; controlling the first-stage downconverter to set a center frequency and bandwidth of the IF1 NB input analog signal; and controlling the second-stage downconverter to set a center frequency and bandwidth of the IF2 NB input analog signal.

Example 16 includes the computer program product of Example 15, the process further including: converting, via one or more digital to analog converters (DACs), a digital output signal to one or more of a first IF1 NB output analog signal, an IF2 NB output analog signal, and a first RF output analog signal; converting, via a second-stage upconverter, the IF2 NB output analog signal to a second IF1 NB output analog signal or to a mmW output analog signal; converting, via a first-stage upconverter, the first IF1 NB output analog signal or the second IF1 NB output analog signal to a second RF output analog signal; controlling the second-stage upconverter to set a center frequency and bandwidth of the IF1 NB output analog signal or the mmW output analog signal; and controlling the first-stage upconverter to set a center frequency and bandwidth of the second RF output analog signal.

Example 17 includes the computer program product of Example 15 or 16, the process further including: filtering a received RF signal to an RF bandwidth to generate the RF input analog signal; and filtering a received mmW signal to an mmW bandwidth to generate the mmW input analog signal.

Example 18 includes the computer program product of Example 17, wherein the RF bandwidth is in a range of 0.1 GigaHertz (GHz) to 20 GHz, and the mmW bandwidth is in a range of 20 GHz to 60 GHz.

Example 19 includes the computer program product of any one of Examples 15 through 18, the process further including: generating a first control signal to select either the IF1 NB input analog signal or the mmW input analog signal for conversion by the second-stage downconverter; generating a second control signal to select either the IF1 NB output analog signal or the second IF1 NB output analog signal for conversion by the first-stage upconverter; and generating a third control signal to cause the second-stage upconverter to either route the second IF1 NB output analog signal to the first-stage upconverter or to route the mmW output analog signal to the mmW transmit antenna.

Example 20 includes the computer program product of any one of Examples 15 through 19, the process further including: analyzing the digital input signals to detect a density of signals exceeding a density threshold and to detect saturation of the one or more ADCs; controlling the first-stage downconverter based on the detected density and/or the detected saturation; controlling the second-stage downconverter based on the detected density and/or the detected saturation; generating the first control signal based on the detected density and/or the detected saturation; controlling the first-stage upconverter based on the detected density and/or the detected saturation; controlling the second-stage upconverter based on the detected density and/or the detected saturation; and generating the second control signal and the third control signal based on the detected density and/or the detected saturation. In still other examples, the process may include any sub-combination of these functions recited in Example 20, including one or more of the recited functions.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be appreciated in light of this disclosure. The present disclosure should, therefore, be considered to encompass such combinations, variations, and modifications. It is intended that the scope of the present disclosure be limited not by this detailed description, but rather by the claims appended hereto. Future filed applications claiming priority to this application may claim the disclosed subject matter in a different manner and may generally include any set of one or more elements as variously disclosed or otherwise demonstrated herein.

What is claimed is:

1. A transceiver system comprising:
a receiver comprising
    a first-stage downconverter configured to convert a radio frequency (RF) input analog signal to a first intermediate frequency (IF1) narrowband (NB) input analog signal, and
    a second-stage downconverter configured to convert the IF1 NB input analog signal or a millimeter wave (mmW) input analog signal to a second intermediate frequency (IF2) NB input analog signal;
one or more analog to digital converters (ADCs) configured to convert one or more of the IF1 NB input analog signal, the IF2 NB input analog signal, and the RF input analog signal to digital input signals; and
a processor configured to control the first-stage downconverter to set a center frequency and bandwidth of the IF1 NB input analog signal and control the second-stage downconverter to set a center frequency and bandwidth of the IF2 NB input analog signal.

2. The transceiver system of claim 1, comprising:
one or more digital to analog converters (DACs) configured to convert a digital output signal to one or more of a first IF1 NB output analog signal, an IF2 NB output analog signal, and a first RF output analog signal; and
a transmitter comprising
    a second-stage upconverter configured to convert the IF2 NB output analog signal to a second IF1 NB output analog signal or to a mmW output analog signal, and a first-stage upconverter configured to convert the first IF1 NB output analog signal or the second IF1 NB output analog signal to a second RF output analog signal;
wherein the processor is configured to control the second-stage upconverter to set a center frequency and bandwidth of the IF1 NB output analog signal or the mmW output analog signal and control the first-stage upconverter to set a center frequency and bandwidth of the second RF output analog signal.

3. The transceiver system of claim 1, comprising:
an RF receive antenna configured to receive an RF signal;
an RF wideband (WB) filter coupled to the RF receive antenna and configured to filter the received RF signal to an RF bandwidth to generate the RF input analog signal;
a mmW receive antenna configured to receive a mmW signal; and
a mmW filter coupled to the mmW receive antenna and configured to filter the received mmW signal to an mmW bandwidth to generate the mmW input analog signal.

4. The transceiver system of claim 3, wherein the RF bandwidth is in a range of 0.1 GigaHertz (GHz) to 20 GHz, and the mmW bandwidth is in a range of 20 GHz to 60 GHz.

5. The transceiver system of claim 1, wherein the processor is configured to:
generate a first control signal to select either the IF1 NB input analog signal or the mmW input analog signal for conversion by the second-stage downconverter;
generate a second control signal to select either the IF1 NB output analog signal or the second IF1 NB output analog signal for conversion by the first-stage upconverter; and
generate a third control signal to cause the second-stage upconverter to either route the second IF1 NB output analog signal to the first-stage upconverter or to route the mmW output analog signal to the mmW transmit antenna.

6. The transceiver system of claim 5, wherein the processor is configured to:
analyze the digital input signals to detect a density of signals exceeding a density threshold and to detect saturation of the one or more ADCs;
control the first-stage downconverter based on the detected density and/or the detected saturation;
control the second-stage downconverter based on the detected density and/or the detected saturation; and
generate the first control signal based on the detected density and/or the detected saturation.

7. The transceiver system of claim 6, wherein the processor is configured to:
control the first-stage upconverter based on the detected density and/or the detected saturation;
control the second-stage upconverter based on the detected density and/or the detected saturation; and
generate the second control signal and the third control signal based on the detected density and/or the detected saturation.

8. A method for operating a transceiver, the method comprising:
converting, via a first-stage downconverter, a radio frequency (RF) input analog signal to a first intermediate frequency (IF1) narrowband (NB) input analog signal;

converting, via a second-stage downconverter, the IF1 NB input analog signal or a millimeter wave (mmW) input analog signal to a second intermediate frequency (IF2) NB input analog signal;

converting, via one or more analog to digital converters (ADCs), one or more of the IF1 NB input analog signal, the IF2 NB input analog signal, and the RF input analog signal to digital input signals;

controlling the first-stage downconverter to set a center frequency and bandwidth of the IF1 NB input analog signal; and controlling the second-stage downconverter to set a center frequency and bandwidth of the IF2 NB input analog signal.

9. The method of claim 8, comprising:

converting, via one or more digital to analog converters (DACs), a digital output signal to one or more of a first IF1 NB output analog signal, an IF2 NB output analog signal, and a first RF output analog signal;

converting, via a second-stage upconverter, the IF2 NB output analog signal to a second IF1 NB output analog signal or to a mmW output analog signal;

converting, via a first-stage upconverter, the first IF1 NB output analog signal or the second IF1 NB output analog signal to a second RF output analog signal;

controlling the second-stage upconverter to set a center frequency and bandwidth of the IF1 NB output analog signal or the mmW output analog signal; and controlling the first-stage upconverter to set a center frequency and bandwidth of the second RF output analog signal.

10. The method of claim 8, comprising:

filtering a received RF signal to an RF bandwidth to generate the RF input analog signal; and filtering a received mmW signal to an mmW bandwidth to generate the mmW input analog signal.

11. The method of claim 10, wherein the RF bandwidth is in a range of 0.1 GigaHertz (GHz) to 20 GHz, and the mmW bandwidth is in a range of 20 GHz to 60 GHz.

12. The method of claim 8, comprising:

generating a first control signal to select either the IF1 NB input analog signal or the mmW input analog signal for conversion by the second-stage downconverter;

generating a second control signal to select either the IF1 NB output analog signal or the second IF1 NB output analog signal for conversion by the first-stage upconverter; and generating a third control signal to cause the second-stage upconverter to either route the second IF1 NB output analog signal to the first-stage upconverter or to route the mmW output analog signal to the mmW transmit antenna.

13. The method of claim 12, comprising:

analyzing the digital input signals to detect a density of signals exceeding a density threshold and to detect saturation of the one or more ADCs;

controlling the first-stage downconverter based on the detected density and/or the detected saturation;

controlling the second-stage downconverter based on the detected density and/or the detected saturation; and generating the first control signal based on the detected density and/or the detected saturation.

14. The method of claim 13, comprising:

controlling the first-stage upconverter based on the detected density and/or the detected saturation;

controlling the second-stage upconverter based on the detected density and/or the detected saturation; and generating the second control signal and the third control signal based on the detected density and/or the detected saturation.

15. A computer program product including one or more non-transitory machine-readable mediums encoded with instructions that when executed by one or more processors cause a process to be carried out for operating a transceiver, the process comprising:

converting, via a first-stage downconverter, a radio frequency (RF) input analog signal to a first intermediate frequency (IF1) narrowband (NB) input analog signal;

converting, via a second-stage downconverter, the IF1 NB input analog signal or a millimeter wave (mmW) input analog signal to a second intermediate frequency (IF2) NB input analog signal;

converting, via one or more analog to digital converters (ADCs), one or more of the IF1 NB input analog signal, the IF2 NB input analog signal, and the RF input analog signal to digital input signals;

controlling the first-stage downconverter to set a center frequency and bandwidth of the IF1 NB input analog signal; and controlling the second-stage downconverter to set a center frequency and bandwidth of the IF2 NB input analog signal.

16. The computer program product of claim 15, the process comprising:

converting, via one or more digital to analog converters (DACs), a digital output signal to one or more of a first IF1 NB output analog signal, an IF2 NB output analog signal, and a first RF output analog signal;

converting, via a second-stage upconverter, the IF2 NB output analog signal to a second IF1 NB output analog signal or to a mmW output analog signal;

converting, via a first-stage upconverter, the first IF1 NB output analog signal or the second IF1 NB output analog signal to a second RF output analog signal;

controlling the second-stage upconverter to set a center frequency and bandwidth of the IF1 NB output analog signal or the mmW output analog signal; and controlling the first-stage upconverter to set a center frequency and bandwidth of the second RF output analog signal.

17. The computer program product of claim 15, the process comprising:

filtering a received RF signal to an RF bandwidth to generate the RF input analog signal; and filtering a received mmW signal to an mmW bandwidth to generate the mmW input analog signal.

18. The computer program product of claim 17, wherein the RF bandwidth is in a range of 0.1 GigaHertz (GHz) to 20 GHz, and the mmW bandwidth is in a range of 20 GHz to 60 GHz.

19. The computer program product of claim 15, the process comprising:

generating a first control signal to select either the IF1 NB input analog signal or the mmW input analog signal for conversion by the second-stage downconverter;

generating a second control signal to select either the IF1 NB output analog signal or the second IF1 NB output analog signal for conversion by the first-stage upconverter; and generating a third control signal to cause the second-stage upconverter to either route the second IF1 NB output analog signal to the first-stage upconverter or to route the mmW output analog signal to the mmW transmit antenna.

20. The computer program product of claim 19, the process comprising:

analyzing the digital input signals to detect a density of signals exceeding a density threshold and to detect saturation of the one or more ADCs;

controlling the first-stage downconverter based on the detected density and/or the detected saturation;

controlling the second-stage downconverter based on the detected density and/or the detected saturation;

generating the first control signal based on the detected density and/or the detected saturation;

controlling the first-stage upconverter based on the detected density and/or the detected saturation;

controlling the second-stage upconverter based on the detected density and/or the detected saturation; and generating the second control signal and the third control signal based on the detected density and/or the detected saturation.

\* \* \* \* \*